United States Patent
Chiba et al.

[11] Patent Number: 5,821,883
[45] Date of Patent: Oct. 13, 1998

[54] DATA MODULATION APPARATUS AND DATA MODULATION APPARATUS INCLUDING MEANS FOR ADDING CONSTANT DATA TO THE ENDS OF INPUT ADDRESS DATA AND RECORDING DATA NECESSARY FOR RUN-LENGTH LIMITED (1,7) DECODING

[75] Inventors: Nobuhiro Chiba; Yasuo Iwasaki, both of Kanagawa, Japan

[73] Assignee: Sony Corporation, Tokyo, Japan

[21] Appl. No.: 934,708

[22] Filed: Sep. 22, 1997

Related U.S. Application Data

[63] Continuation of Ser. No. 495,907, Jun. 28, 1995, abandoned.

[30] Foreign Application Priority Data

Jun. 30, 1994 [JP] Japan .................................. 6-150056

[51] Int. Cl.[6] ............................................. H03M 7/00
[52] U.S. Cl. .............................................. 341/59; 360/40
[58] Field of Search ........................... 341/58, 59; 360/39, 360/40; 369/59

[56] References Cited

U.S. PATENT DOCUMENTS

| | | | |
|---|---|---|---|
| 4,413,251 | 11/1983 | Adler et al. | 340/347 |
| 4,488,142 | 12/1984 | Franaszek | 340/347 |
| 5,099,237 | 3/1992 | Fitingof | 341/59 |
| 5,327,124 | 7/1994 | Funamoto | 341/58 |
| 5,349,350 | 9/1994 | Blagaila | 341/59 |
| 5,418,657 | 5/1995 | Machado et al. | 360/40 |
| 5,420,636 | 5/1995 | Kojima | 348/403 |
| 5,432,799 | 7/1995 | Shimpuku et al. | 371/59 |
| 5,506,581 | 4/1996 | Ino et al. | 341/58 |
| 5,537,422 | 7/1996 | Shimpuku et al. | 371/42 |

Primary Examiner—Howard L. Williams
Attorney, Agent, or Firm—Limbach & Limbach L.L.P.

[57] ABSTRACT

A data modulation apparatus for modulating data by run-length limited (1,7) modulation including constant data adding means for receiving input data and adding constant data after the input data, status data producing means for performing, in each modulation period, logical operations on at least part of the data output by the constant data adding means of each modulation period and the status data of the modulation period immediately before each modulation period to produce status data of each modulation period, and modulated data producing means for performing, in each modulation period, logical operations on the data output by the constant data adding means of each modulation period and the status data of the modulation period immediately before each modulation period to perform run-length limited (1,7) modulation and produce modulated data. Also, a data demodulation apparatus, run-length limited (1,7) modulated data recording apparatus, and a recording medium used with the same.

5 Claims, 7 Drawing Sheets

DATA MODULATION APPARATUS AND DATA MODULATION APPARATUS INCLUDING MEANS FOR ADDING CONSTANT DATA TO THE ENDS OF INPUT ADDRESS DATA AND RECORDING DATA NECESSARY FOR RUN-LENGTH LIMITED (1,7) DECODING

This is a continuation of application Ser. No. 08/495,907 filed on Jun. 28, 1995 now abandoned.

BACKGROUND OF THE INVENTION

1. Field of the Invention

The present invention relates to a data modulation apparatus for modulating data input by run-length limited (RLL) modulation etc., a data demodulation apparatus for demodulating modulated data recorded on an optical recording medium, a data recording apparatus for recording data on an opto-magnetic disk or other optical recording medium using the data modulation apparatus, and a recording medium used with the same.

2. Description of the Related Art

When recording data on a magnetic disk or other recording medium, the data which are input are modulated (encoded) to improve the error rate etc. before recording. As one encoding method, there is known for example the run-length limited (RLL) modulation method (run-length limited encoding method) disclosed in Japanese Examined Patent Publication (Kokoku) No. 63-7051 (corresponding U.S. Pat. No. 4,413,251).

The above run-length limited modulation method is called run-length limited (1,7) modulation (below, "RLL(1,7) encoding" or "(1,7) RLL encoding"). It limits the run length of the "0"s in the encoded data to within a range of 1 to 7 and encodes two bits of input data as three bits of encoded data.

RLL(1,7) encoding produces encoded data by performing predetermined logical operations on two bits of input data each encoding period and the status data showing the state of the previous period to successively encode the data.

The encoded data of each encoding period of the encoded data train obtained by successive RLL(1,7) encoding are demodulated (decoded) by performing predetermined logical operations on the three bits of encoded data of two encoding periods later, the three bits of encoded data of one encoding period later, and the one bit of encoded data of after that encoding period.

The encoded data obtained by the RLL(1,7) encoding explained above have a low propagation of data error arising from random noise of not more than 5 bits.

The RLL(1,7) encoding and the decoding of the encoded data obtained by the RLL(1,7) encoding (RLL(1,7) decoding) are characterized by the extremely simple nature of the hardware needed for implementing them and the suitability for high speed encoding operations and high speed decoding operations.

To decode encoded data obtained by RLL(1,7) encoding, however, it is necessary to use not only the encoded data of that encoding period, but also the encoded data of the encoding periods after that encoding period. This means that it is not possible to decode the encoded data at the very end.

SUMMARY OF THE INVENTION

An object of the present invention is to provide a data modulation apparatus and data demodulation apparatus enabling accurate demodulation (decoding) to the end of modulated data produced by a method wherein encoded data of a plurality of encoding periods, such as run-length limited encoded (modulated) data, have a predetermined relationship and a data recording apparatus and recording medium used with the same.

According to a first aspect of the present invention, there is provided a data modulation apparatus for modulating data by run-length limited (1,7) modulation including a constant data adding means for receiving input data and adding constant data at the end of the input data, a status data producing means for performing, in each modulation period, logical operations on at least part of the data output by the constant data adding means of each modulation period and the status data of the modulation period immediately before each modulation period to produce status data of each modulation period, and a modulated data producing means for performing, in each modulation period, logical operations on the data output by the constant data adding means of each modulation period and the status data of the modulation period immediately before each modulation period to perform run length-limited (1,7) modulation and produce modulated data.

Preferably, the constant data added by the constant data adding means is data of at least the number of bits necessary when the last data of the input data is to be decoded.

According to a second aspect of the present invention, there is provided a data demodulation apparatus which receives modulated data obtained by modulation of data at the end of which constant data has been added and decodes the modulated data, including means for demodulating the modulated input data by performing logical operations based on run-length limited (1,7) demodulation on the modulated data of each modulation period and the modulation data of the modulation period before each modulation period, the modulated data corresponding to the last of the input data being demodulated using the modulated data corresponding to the constant data.

According to a third aspect of the present invention, there is provided a run-length limited (1,7) modulated data recording apparatus including constant data adding means for receiving input data and adding constant data after the input data, status data producing means for performing, in each modulation period, logical operations on at least part of the data output by the constant data adding means of each modulation period and the status data of the modulation period immediately before each modulation period to produce status data of each modulation period, modulated data producing means for performing, in each modulation period, logical operations on the data output by the constant data adding means of each modulation period and the status data of the modulation period immediately before each modulation period to perform run-length limited (1,7) modulation and produce modulated data, and recording means for recording the modulated data produced by the modulated data producing means on a recording medium.

Preferably, the input data includes recorded data and address data showing the addresses of the recorded data on the recording medium, and the constant data adding means adds known constant data to the ends of each of the recorded data and address data.

According to a fourth aspect of the present invention, there is provided a recording medium on which are recorded data obtained by run-length limited modulation of recorded data, first known constant data added to the end of the recorded data, address data showing the recording positions of the recorded data on a recording medium, and second known constant data added to the end of the address data.

Preferably, the run-length limited encoding is run-length limited (1,7) modulation.

BRIEF DESCRIPTION OF THE DRAWINGS

These and other objects and features of the present invention will become clear from the following description of the preferred embodiments given in reference to the attached drawings, wherein

FIGS. 7A to 7C are views of a recording format of the sector of the opto-magnetic disk shown in FIG. 6, wherein FIG. 7A shows the recording format of the sector, FIG. 7B shows the recording format of the ID1 area (ID1), ID2 area (ID2), and ID3 area (ID3) shown in FIG. 7A, and FIG. 7C shows the recording format of the data area shown in FIG. 7A.

DESCRIPTION OF THE PREFERRED EMBODIMENTS

The configurations of the data modulation apparatus, data demodulation apparatus, and other aspects of the present invention will be explained next with reference to the drawings.

First, the configuration of a data recording and reproduction apparatus 1 of the present invention will be explained with reference to FIG. 1.

Figure 1:
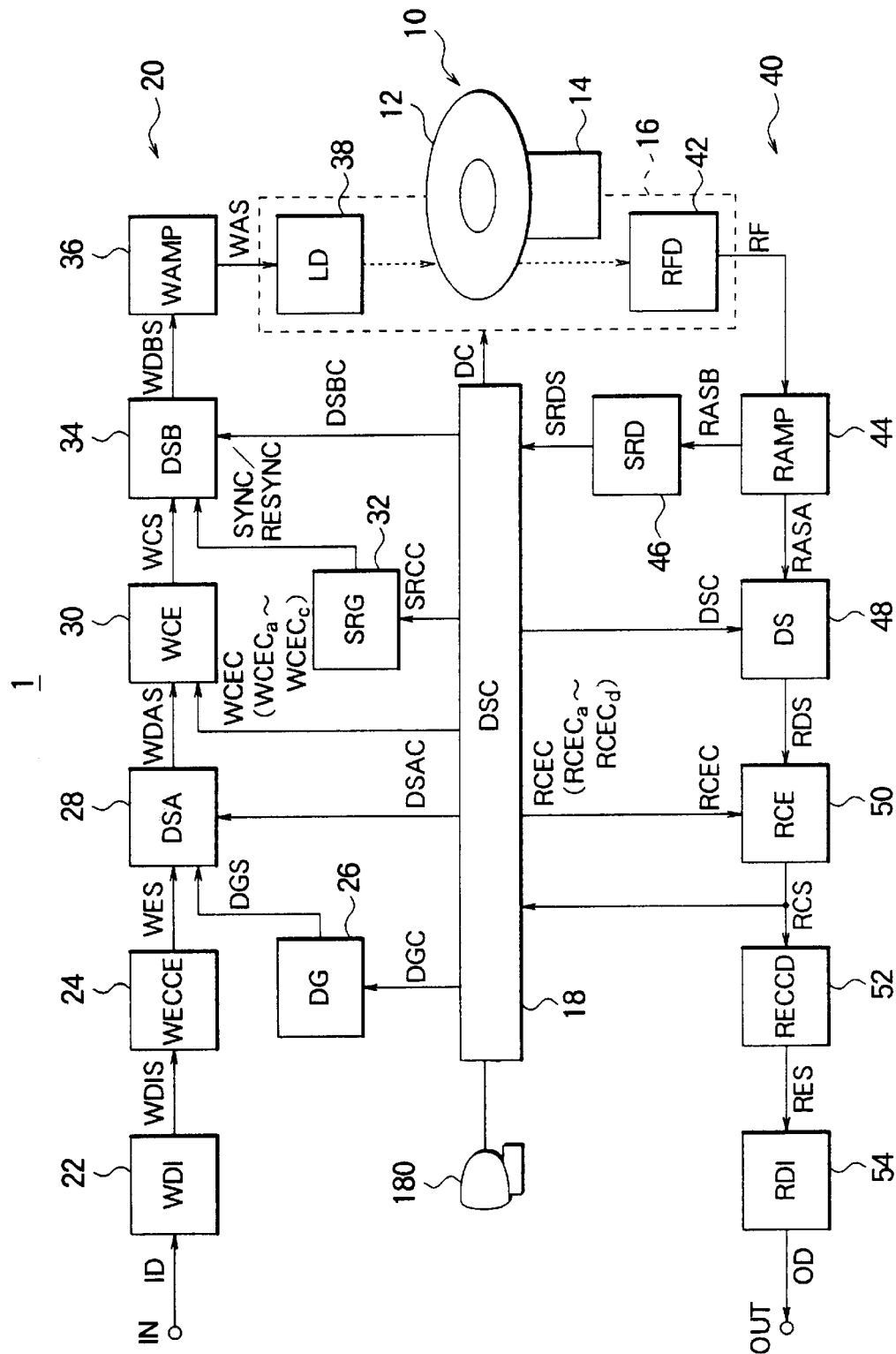
FIG. 1 is a view of the configuration of a data recording and reproduction apparatus.

FIG. 1 is a view of the configuration of the data recording and reproduction apparatus 1.

As shown in FIG. 1, the data recording and reproduction apparatus 1 includes a disk system 10, a control apparatus (DSC) 18, a data recording apparatus 20, and a data reproduction apparatus 40.

The data recording and reproduction apparatus 1 records on an opto-magnetic disk 12 the encoded data obtained by modulation (encoding) by run-length limited (1,7) modulation (hereinafter referred to as "RLL(1,7) encoding") of input data ID applied to an input terminal IN each certain period (modulation timing, hereinafter referred to as "encoding period") and reads the encoded data recorded on the opto-magnetic disk 12 and demodulates (decodes) them to output them from an output terminal OUT.

The opto-magnetic disk 12 is an opto-magnetic disk from and on which data is read and written using laser light and magnetism. Note that the recording format of the opto-magnetic disk 12 will be explained later with reference to FIG. 6 and FIGS. 7A to 7C.

The disk system 10 is comprised of the opto-magnetic disk 12, a disk drive system 14 and an optical system 16.

The disk drive system 14 includes a motor and a control system thereof, and turns the opto-magnetic disk 12 under the control of the control apparatus 18.

The optical system (optical head) 16 has a laser diode (LD) 38 and photodetector (RFD) 42 and performs the writing and reading of data with respect to the opto-magnetic disk 12.

The disk system control apparatus (DSC) 18 controls the components of the disk system 10, data recording apparatus 20, and data reproduction apparatus 40 using control signals such as DGC, DSAC, WCEC, SRGC, DC, RCEC, and DSC, based on control data designating operations of the data recording and reproduction apparatus 1 and a synchronization detection signal SRDS detected by a synchronization detection circuit (SRD) 46.

A control data setting terminal 180 such as a CRT display with a key board outputs the control data set by the user of the data recording and reproduction apparatus to the control apparatus 18.

The data recording apparatus 20 includes a data input circuit (WDI) 22, write data ECC encoder (WECCE) 24, constant data generating circuit (DG) 26, first data selection circuit (DSA) 28, write data encoding circuit (WCE) 30, synchronization signal generating circuit (SRG) 32, second data selection circuit (DSB) 34, and laser drive amplifier circuit (WAMP) 36.

The data recording apparatus 20 encodes the input data ID by RLL(1,7) encoding to produce encoded data and records the result on the opto-magnetic disk 12 through the laser diode 38. Note that the configuration and operation of the data encoding circuit 30 will be explained later in detail with reference to FIG. 2 and FIG. 3.

The data reproduction apparatus 40 includes a reproduced signal amplification circuit (RAMP) 44, a synchronization detection circuit (SRD) 46, a third data selection circuit (DS) 48, a reproduction data decoding circuit (RCE) 50, a reproduction data ECC decoder (RECCD) 52, and a decoded data output circuit (RDI) 54.

The data reproduction apparatus 40 detects the encoded data from the reproduced signal RF input from the photodetector 42 and demodulates it (decodes it) by RLL(1,7) decoding to reproduce the input data ID. Note that the configuration and operation of the data decoding circuit 50 will be described later with reference to FIG. 4 and FIG. 5.

Below, an explanation will be made of the configuration and operation of the data encoding circuit 30 with reference to FIG. 2 and FIG. 3.

Figure 2:
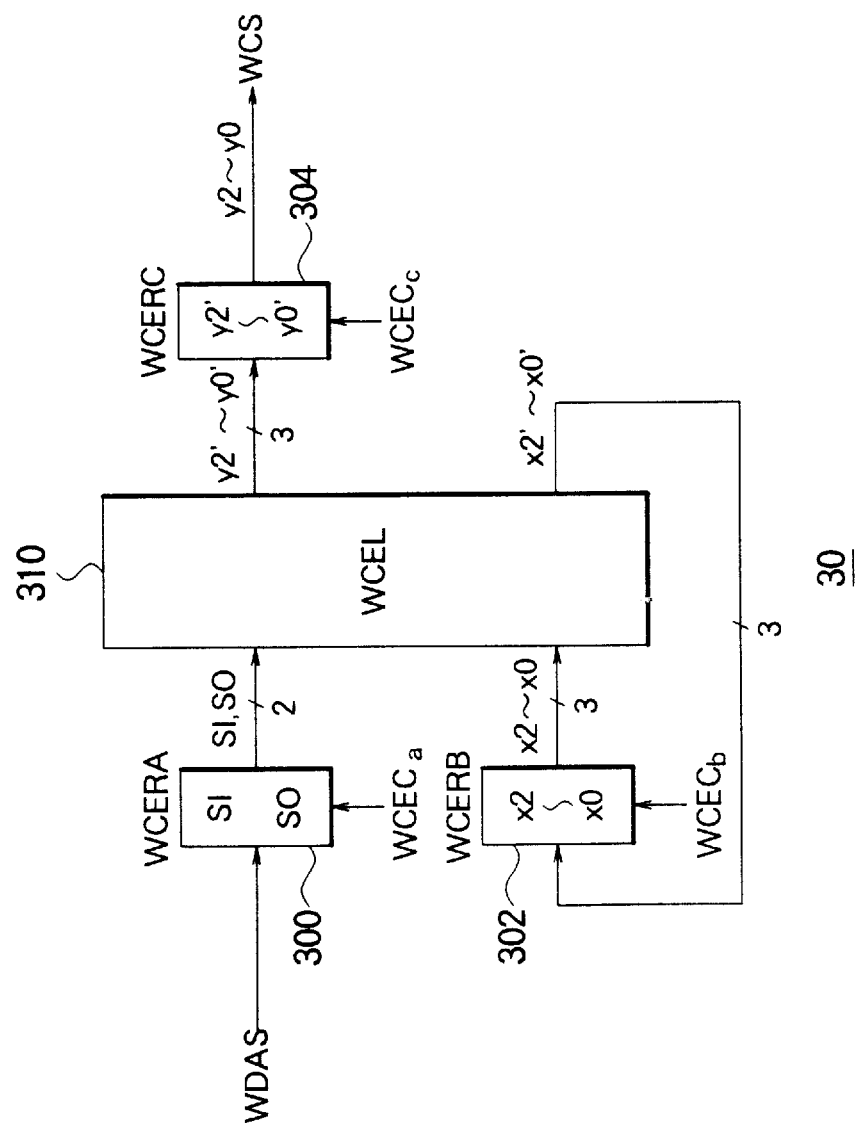
FIG. 2 is a view of the configuration of data encoding circuit shown in FIG. 1.

FIG. 2 is a view of the configuration of the data encoding circuit 30 shown in FIG. 1. FIG. 3 is a view of the configuration of a write data encoding circuit (WCEL) 310 shown in FIG. 2.

As shown in FIG. 2, the data encoding circuit 30 includes a first register (WCERA) 300, a second register (WCERB) 302, a write data encoding circuit (WCEL) 310, and a third register (WCERC) 304.

The data encoding circuit 30 encodes by RLL(1,7) encoding the signal WDAS produced by the ECC encoder 24 adding an error correction code (ECC) to the input data ID input through the data input circuit 22 and by the data selection circuit 28 placing at the end the constant data (four bits of "0").

Figure 3:
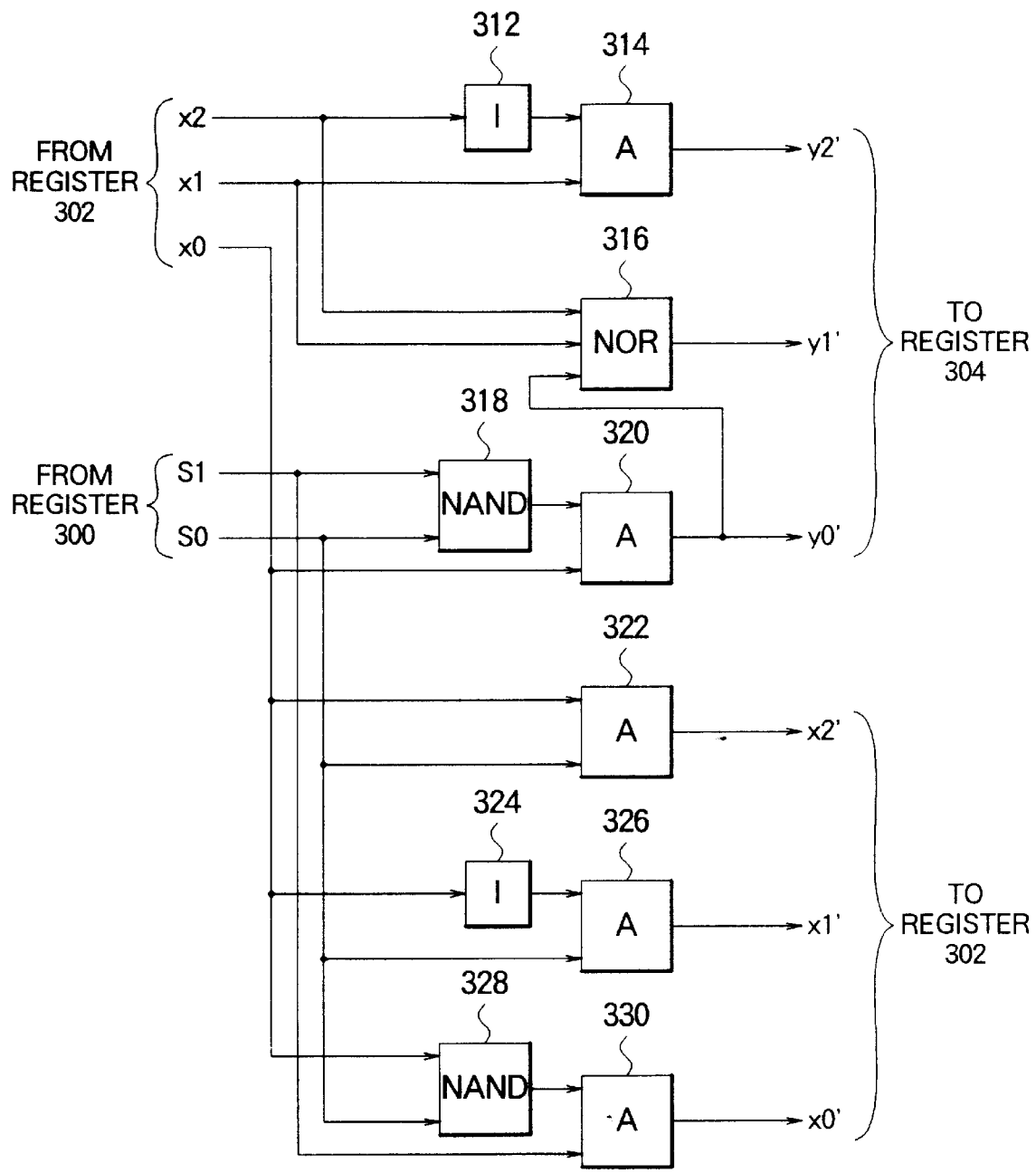
FIG. 3 is a view of the configuration of an encoding circuit (WCEL) shown in FIG. 2.

As shown in FIG. 3, the decoding circuit 310 is comprised of the logical circuits 312, 314, 316, 318, 320, 322, 324, 326, 328, and 330. The logical circuits (A) 314, 320, 322, 328, and 330 calculate the logical product (AND) of the signals which are input, the logical circuits (I) 312 and 324 invert the logical values of the signals which are input, the logical circuits (NAND) 318 and 328 calculate the inverted logical product (NAND) for the input signals, and the logical circuit (NOR) 316 calculates the inverted logical sum (NOR) of the input signal.

The operation of the decoding circuit 310 will be explained below with reference to FIG. 2 and FIG. 3.

The signal WDAS is input to the register (300) serially 1 bit at a time from the first data selection circuit 28 each signal period.

The register 300 shifts the signal WDAS in accordance with the control signal WCECa input from the control apparatus 18 and outputs the result to the decoding circuit 310 every encoding period as the two 1-bit data s0 and s1 each time 2 bits of the signal WDAS is input (each encoding period).

The register 302 records the 3 bits of status data x2', x1', and x0' produced by the decoding circuit 310 at the encoding period just before for each encoding period in accordance with a control signal WCECb input from the control apparatus 18 and outputs the same as the status data x2, x1, and x0 to the decoding circuit 310.

The logical circuit 312 inverts the logical value of the status data x2 input from the register 302 and outputs the result to the logical circuit 314.

The logical circuit 314 outputs the logical product (AND) of the inverted status data x2 input from the logical circuit 312 and the status data x1 as the encoded data y2' to the register 304.

The logical circuit 316 calculates the inverted logical sum (NOR) of the status data x2 and x1 and the encoded data y0' and outputs the result as the encoded data y1' to the register 304.

The logical circuit 318 calculates the inverted logical product (NAND) of the 1-bit data s1 and s0 and outputs the result to the logical circuit 320.

The logical circuit 320 calculates the logical product (AND) of the inverted local product (NAND) of the 1-bit data s1 and s0 input from the logical circuit 318 and the status data x0 and outputs the result as the encoded data y0' to the register 304.

The logical circuit 322 calculates the logical product (AND) of the status data x0 and the 1-bit data s0 and outputs the result as the status data x2' of the encoding period to the register 302.

The logical circuit 324 inverts the logical value of the status data x0 and outputs the result to the logical circuit 326.

The logical circuit 326 calculates the logical product (AND) of the status data x0 with the inverted logical value and the 1-bit data s0 and outputs the result as the status data x1' of the encoding period to the register 302.

The logical circuit 328 calculates the inverted logical product (NAND) of the status data x0 and the 1-bit data s0 and outputs the result to the logical circuit 330.

The logical circuit 330 calculates the logical product (AND) of the signal input from the logical circuit 328 and the 1-bit data s1 and outputs the result as the status data x0' of the encoding period to the register 302.

The register 304 records the encoded data y2', y1', and y0' produced in the encoding period in accordance with a control signal WCECc input from the control apparatus 18, converts them into data of a serial format in the order of the encoded data y2, y1, and y0 in the next encoding period, and outputs the result to the data selection circuit 34.

Due to the operation of the different parts of the data encoding circuit 30, an error correction code is added to the input data ID, and a signal WDAS with the constant data placed at its end is encoded to 3 bits of encoded data every 2 bits each encoding period and output to the second data selection circuit 34.

The configuration and operation of the data decoding circuit 50 will be explained below with reference to FIG. 4 and FIG. 5.

Figure 4:
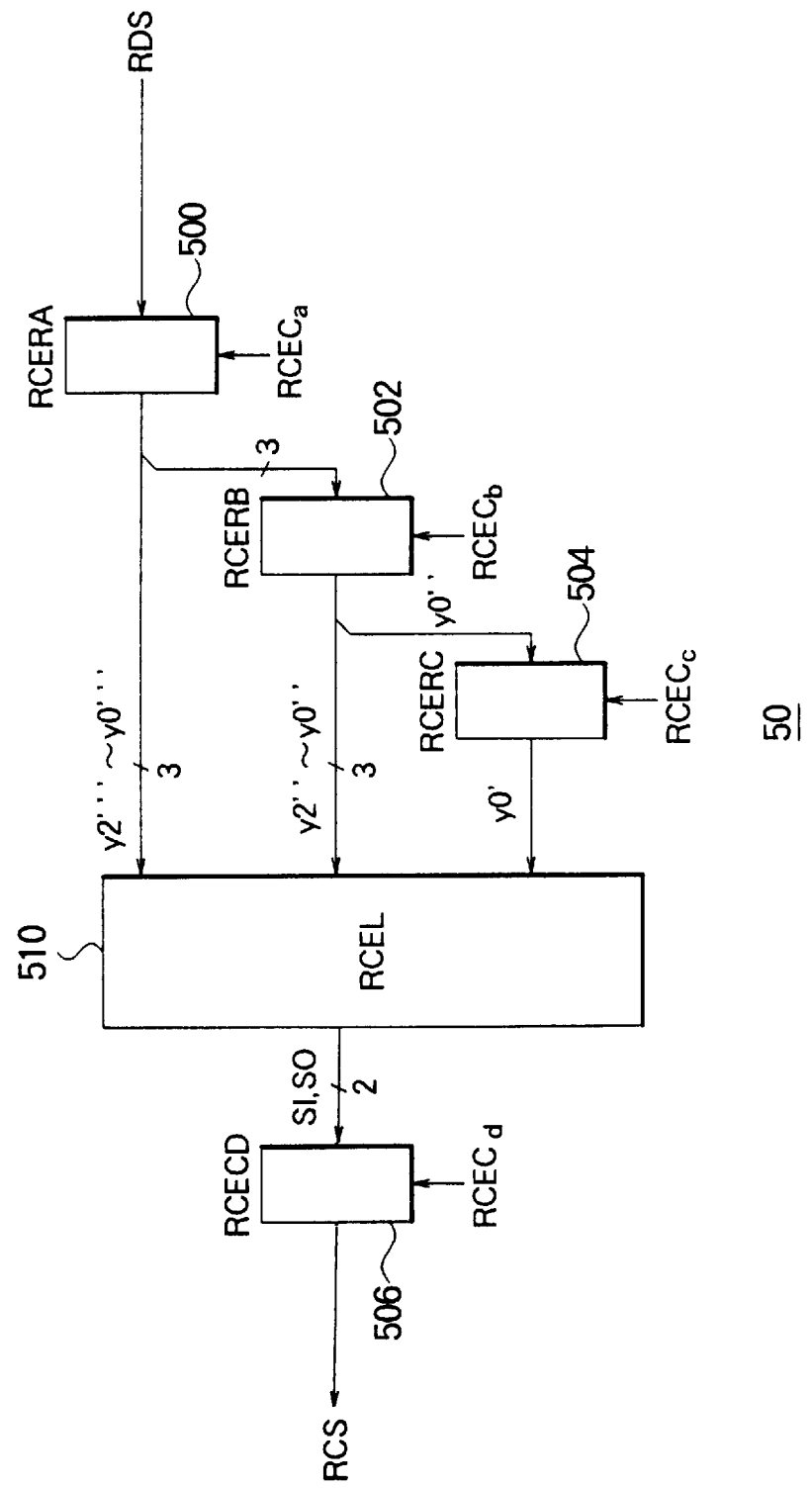
FIG. 4 is view of the configuration of a data decoding circuit shown in FIG. 1.

FIG. 4 is view of the configuration of a data decoding circuit 50 shown in FIG. 1. FIG. 5 is a view of the configuration of a decoding circuit (RCEL) 510 shown in FIG. 4.

As shown in FIG. 4, the data decoding circuit 50 is comprised of a fourth register (RCERA) 500, a fifth register (RCERB) 502, a sixth register (RCERC) 504, a seventh register (RCERD) 506, and a decoding circuit 510.

The data decoding circuit 50 decodes 3 bits of the signal RDS into two bits of data with each input of 3 bits of the signal RDS (each encoding period) produced by producing a radio frequency (high frequency) signal RF by detection by the photodetector 42 of laser light reflected from the opto-magnetic disk 12, amplifying it by the reproduced signal amplification circuit 44, and removing the synchronization data and resynchronization data by the data selection circuit 48.

Figure 5:
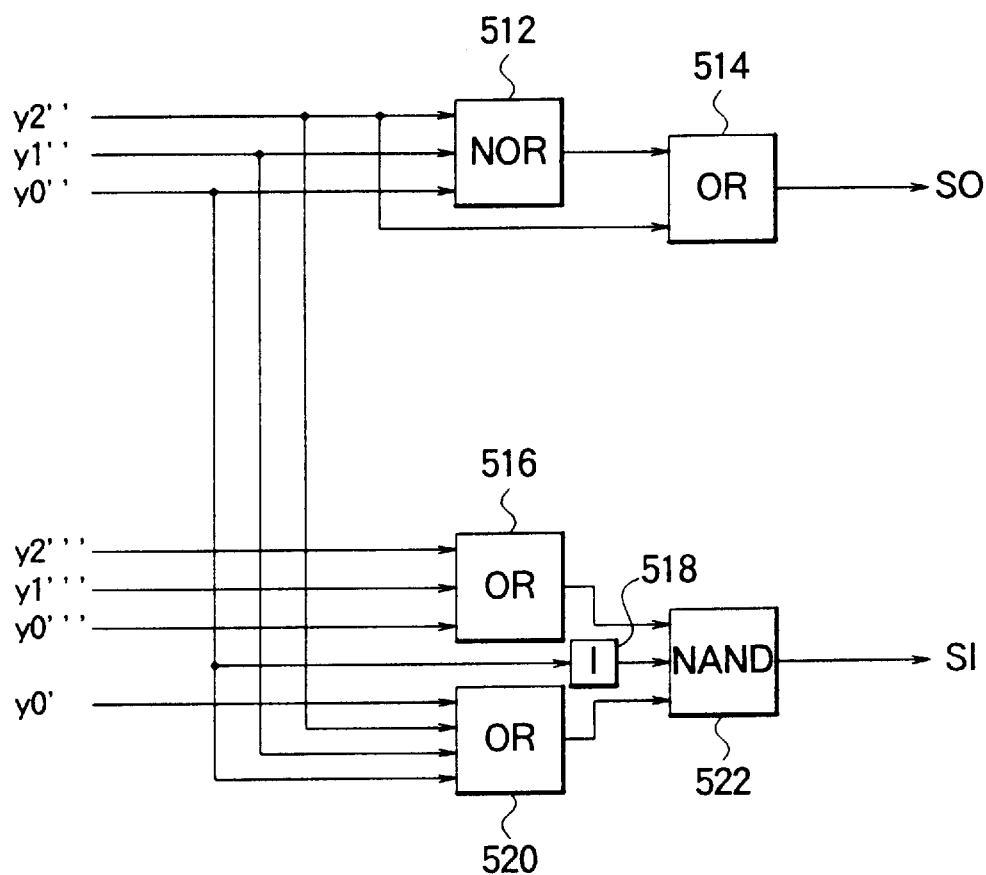
FIG. 5 is a view of the configuration of a decoding circuit (RCEL) shown in FIG. 4.

As shown in FIG. 5, the decoding circuit 510 is comprised of the logical circuits 512, 514, 516, 518, 520, and 522. The logical circuit (NOR) 512 calculates the inverted logical sum (NOR) of the input signal, the logical circuits (OR) 514, 516, and 520 calculate the logical sum (OR) of the input signals, the logical circuit (I) 518 inverts the logical value of the input signal, and the logical circuit (NAND) 522 calculates the inverted logical product (NAND) of the input signal.

The operation of the data decoding circuit 50 will be explained below with reference to FIG. 4 and FIG. 5.

The signal RDS is input successively to the register 500 of the data decoding circuit 50 serially 1 bit at a time each signal period.

The register 500 successively shifts the input signal RDS in accordance with the control signal RCECa input from the control apparatus 18 and outputs the result to the decoding circuit 510 and the register 502 every encoding period as the 3 bits of encoded data y2''', y1''', and y0''' in the order of prior input.

The register 502 records the 3 bits of encoded data input each encoding period in accordance with a control signal RCECb input from the control apparatus 18 and outputs them as the 3 bits of encoded data y2'', y1'', and y0'' to the decoding circuit 510 in the next encoding period and as the encoded data y0'' to the register 504.

The register 504 records the encoded data y0'' input each encoding period from the register 502 in accordance with a control signal RCECc input from the control apparatus 18 and outputs it as the encoded data y0' to the decoding circuit 510 in the next encoding period.

The logical circuit 512 calculates the inverted logical sum (NOR) of the input encoded data y2'', y1'', and y0'' and outputs the result to the logical circuit 514.

The logical circuit 514 calculates the logical sum (OR) of the data y2'' and the NORed data of y2'', y1'', and y0'' from the logical circuit 512 and outputs the result as the decoded data s0 to the register 506.

The logical circuit 516 calculates the logical sum (OR) of the input encoded data y2''', y1''', and y0''' and outputs the result to the logical circuit 522.

The logical circuit 518 inverts the logical value of the input encoded data y0'' and outputs the result to the logical circuit 522.

The logical circuit 520 calculates the logical sum (OR) of the input encoded data y2", y1", y0", and y0' and outputs the result to the logical circuit 522.

The logical circuit 522 calculates the inverted logical product (NAND) of the ORed data of y2'", y1'", and y0'" input from the logical circuit 516, the inverted data of y0" input from the logical circuit 518 and the ORed data of y2", y1", y0", and y0' input from the logical circuit 520 and outputs the result as the decoded data s1 to the register 506.

The register 506 records the decoded data s1 and s0 input from the decoding circuit 510 every encoding period in accordance with a control signal RCECd input from the control apparatus 18 and outputs the result as the serial format signal RCS to the ECC decoder 52 in the next encoding period.

Due to the operation of the different parts of the data decoding circuit 50 explained above, the signal RDS produced by producing the signal RF by detection by the photodetector 42 of laser light reflected from the opto-magnetic disk 12, amplifying it by a reproduced signal amplification circuit 44, and removing the synchronization data and resynchronization data by the data selection circuit 48 is decoded into 2 bits of decoded data every 3 bits each encoding period and output to the ECC decoder 52.

Here, the decoded data s1 and s0 output as the signal RCS from the data decoding circuit 50 are the same as the two 1-bit data s1 and s0 input as the signal WDAS to the data encoding circuit 30.

The recording format of the opto-magnetic disk 12 will be explained below with reference to FIG. 6 and FIGS. 7A to 7C.

Figure 6:
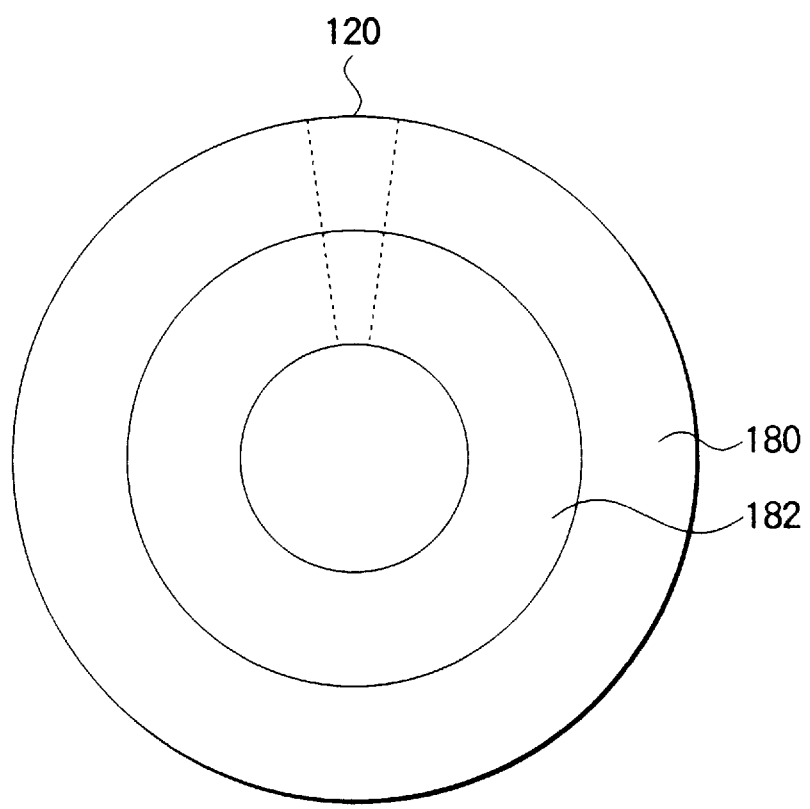
FIG. 6 is a view of a sector of an opto-magnetic disk shown in FIG. 1.

FIG. 6 is a view of a sector of the opto-magnetic disk 12 shown in FIG. 1.

As shown in FIG. 6, the opto-magnetic disk 12 is divided into a channel 1 recording area 180 and a channel 2 recording area 182. The channel 1 recording area 180 has the tracks 1 to 19,500, while the channel 2 recording area 182 has the tracks 19,501 to 39,000.

Each track is divided into 42 sectors 120. The channel 1 recording area 180 and the channel 2 recording area 182 each have 819,000 sectors 120.

Figure 7A:
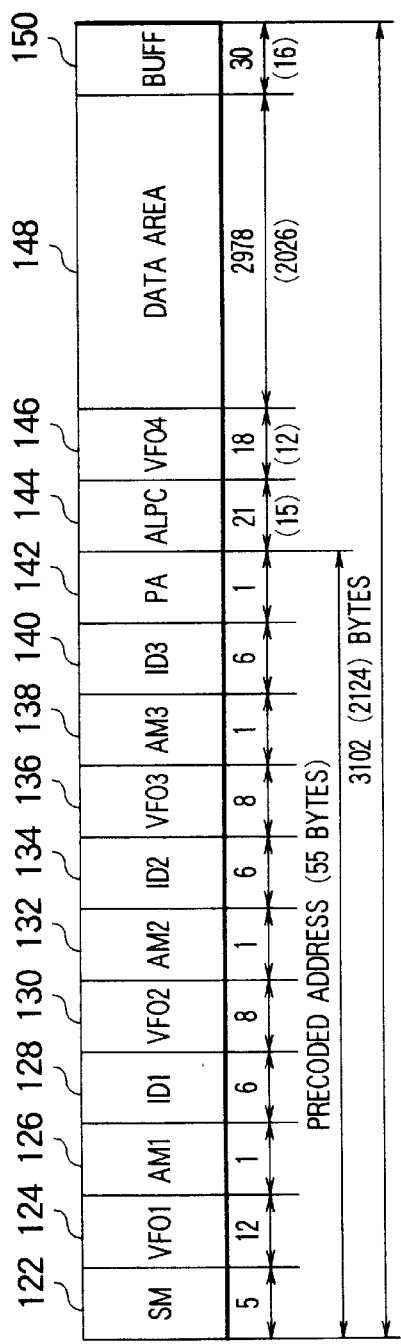

Each sector 120 has data recorded on it in accordance with the recording format as shown in FIG. 7A.

The figures shown (number of tracks and number of sectors) are just one example. Other figures are also possible. Further, while the medium is divided into two parts: channel 1 and channel 2, it need not be divided or may be divided into a greater number of parts.

Figure 7B:
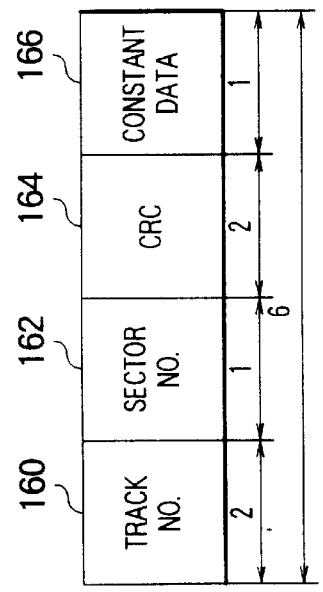
Figure 7C:
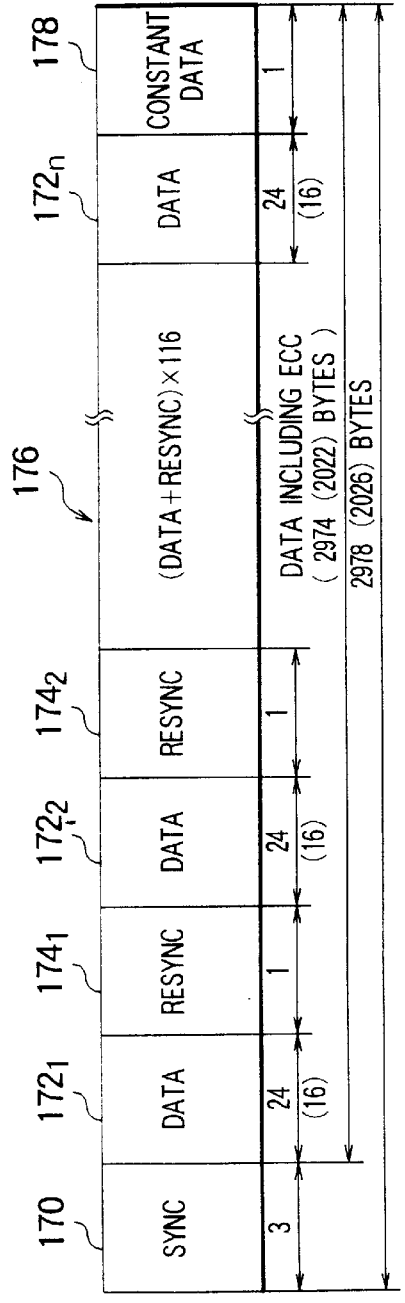

FIGS. 7A to 7C are views of a recording format of the sector of the opto-magnetic disk 12 shown in FIG. 6, wherein FIG. 7A shows the recording format of the sector 120, FIG. 7B shows the recording format of the ID1 area 128, ID2 area 134, and ID3 area 140 shown in FIG. 7A, and FIG. 7C shows the recording format of the data area 148 shown in FIG. 7A. Note that in FIGS. 7A to 7C, the storage capacities of each of the areas of the opto-magnetic disk 12 indicate the capacities of data before RLL(1,7) encoding, while the lengths of data shown in parentheses indicate the lengths of data of the individual portions of a channel 2. When the channel 1 and channel 2 are the same, no parentheses are provided.

The sector 120 is comprised of a 55-byte address portion 122–142, inclusive, a 21 (15)-byte ALPC area 144, an 18 (12)-byte VFO4 area 146, and a 2978 (2026)-byte data area 148 preformed (precoded) on the opto-magnetic disk 12.

The 55-byte address portion is comprised of a 5-byte sector mark (SM) area 122, a 12-byte VFO1 area 124, an 8-byte VFO2 area 130, an 8-byte VFO3 area 136, and a 1-byte each AM1 area 126, AM2 area 132, and AM3 area 138.

The ID1 area 128, ID2 area 134, and ID3 area 140 (hereinafter these areas are referred to together as the "ID areas") each has a recording format as shown in FIG. 7B.

The ID areas are comprised of a 2-byte track no. area 160, a 1-byte sector no. area 162, a 2-byte CRC area 164, and an end-placed data area (constant data) 166.

The data area 148 has the recording format as shown in FIG. 7C.

The data area 148 is comprised of the recording area 176 which includes the synchronization signal (SYNC) 170 and the alternately repeating data area (DATA) $172_i$ and resynchronization (RESYNC) area $174_i$ (n=119, i=1, 2, ... n, j=1, 2, ..., n−1) at the end of which is placed an end-placed data area (constant data) 178.

An explanation will next be made of the data recorded in the main areas of the sector 120 of the opto-magnetic disk 12 shown in FIGS. 7A to 7C.

The sector mark (SM) area 122 has written in it data showing the header of the sector 120.

The VFO1 area 124, VFO2 area 130, VFO3 area 136, and VFO4 area 146 (hereinafter these areas are referred to together as the "VFO areas") have written in them data whose bit patterns change frequently, such as 55h ("55" expressed by hexadecimal) or AAh ("AA" expressed by hexadecimal). The signal RF obtained from these areas is used mainly for reproducing the clock used for the reading of data (note that the h added to the end of the figures 00 to FF, such as 55h, indicates that the figures are hexadecimal.)

The AM1 area 126, AM2 area 132, and AM3 area 138 have written in them data showing that the next area is an ID area.

The track no. area 160 of an ID area has written in it the number of the track to which the sector 120 belongs. The sector no. area 162 has written in it the number of the sector 120. The CRC area 164 has written in it a CRC code for the error correction of the data written in the track no. area 160 and the sector no. area 162. The end-placed data area 166 has written in it the data obtained by RLL(1,7) encoding the constant data (encoded constant data) necessary for the decoding of the final 2 bits of data of the CRC code.

Here, the encoded constant data are 6 bits of data corresponding to constant data of 4 bits of "0", so the remaining 4 bits may be any data.

The encoded constant data written in the end-placed data area 166 is the data necessary for the RLL(1,7) decoding of the last 2 bits of the CRC code written in the CRC area 164.

The synchronization signal area 170 of the data area 148 has written in it the data used for the detection of synchronization.

The data area $172_i$ has written in it the encoded data obtained by encoding the input data ID by RLL(1,7) encoding.

The resynchronization signal area 174 has written in it the data used for detection of resynchronization.

The end-placed data area 178 has written in it the encoded constant data. The encoded constant data written in the end-placed data area 178, like the end-placed data area 166, is data required for the RLL(1,7) decoding of the last 2 bits of the data written in the data area $172_n$.

As shown in FIG. 4, when performing RLL(1,7) decoding by the data decoding circuit 50, the decoding of the final encoded data y0' requires in addition to the encoded data y0' the 6 bits of encoded data (4 bits converted to input data ID) of the subsequent encoded data y2", y1", y0", y2'", y1'", and y0'". Accordingly, in the data recording and reproduction apparatus 1 of the present embodiment, the encoded constant data recorded in the end-placed data areas 166 and 178 need only be 6 bits of encoded data obtained by RLL(1,7) encoding of 4 bits of known input data ID. Normally, in a data recording and reproduction apparatus, data is handled in units of 8 bits (8 bits as data before encoding and 12 bits as data after encoding), so the end-placed data areas 166 and 177 also are made 8 bits (8 bits as data before encoding and 12 bits as data after encoding).

Note that among the parts of the data recording and reproduction apparatus 1 explained above, the data recording apparatus 20 and the disk system 10 correspond to the data recording apparatus according to the present invention, while the data reproduction apparatus 40 and disk system 10 correspond to the data reproduction apparatus according to the present invention.

Further, the data encoding circuit 30 corresponds to the data modulation apparatus of the present invention, the logical circuits 312, 314, 316, 318, and 320 of the decoding circuit 310 correspond to the modulated data processing means according to the present invention, the logical circuits 322, 324, 326, 328, and 330 of the decoding circuit 310 correspond to the status data producing means according to the present invention, and the constant data generation circuit 26 and data selection circuit 28 correspond to the constant data adding means according to the present invention.

Further, the data decoding circuit 50 corresponds to the data demodulation apparatus according to the present invention, the registers 500, 502, and 504 correspond to a data holding means according to the present invention, and the decoding circuit 510 corresponds to a decoding means according to the present invention.

An explanation will be made below of the operation of the data recording and reproduction apparatus 1 of the present invention referring to the figures explained above.

First, an explanation will be made of the case of the data recording apparatus 20 of the data recording and reproduction apparatus 1 writing data on the opto-magnetic disk 12.

Input data ID are input serially to the input terminal IN.

The input data ID are input through the data input circuit 22 as the signal WDIS to the ECC encoder 24.

The ECC encoder 24 adds the error correction code (ECC) to the signal WDIS and outputs the result as the signal WES to the data selection circuit 28.

The constant data generation circuit 26 generates constant data DGS to be written in the end-placed data area 178 in accordance with the control through the control signal DGC of the control apparatus 18 and inputs the same to the data selection circuit 28.

The data selection circuit 28 selects one of the signal WES and constant data DGS in accordance with control of the constant signal DSA of the control apparatus 18. That is, the data selection circuit 28 places the constant data DGS at the end of the signal WES recorded at the position of the data area $172_n$ and outputs the result as the signal WDAS to the data encoding circuit 30.

The data encoding circuit 30 performs RLL(1,7) encoding on the signal WDAS each time 2 bits of the input signal ID are input (each encoding period) in accordance with control through the signal WCEC of the control apparatus 18 and outputs the result as the signal WCS to the data selection circuit 34.

The synchronization signal generation circuit 32 produces a resynchronization signal RESYNC in accordance with control through the control signal SRCC of the control apparatus 18 and outputs the result to the data selection circuit 34.

The data selection circuit 34 selects one of the signal WCS and the resynchronization signal RESYNC in accordance with the control signal DSBC of the control apparatus 18. That is, the data selection circuit 34 divides the signal WCS into the portions to be written in the data areas $172_i$, inserts the resynchronization signal RESYNC to be written in the resynchronization signal areas $174_j$ between the data areas $172_i$, and outputs the result as the signal WDBS to the laser drive circuit 36.

The laser drive amplifier circuit 36 amplifies the signal WDBS and outputs the result as the signal WAS to the laser diode 38.

The disk system 10 rotates the opto-magnetic disk 12 in accordance with the disk control signal DC of the control apparatus 18, moves the optical system (optical head) 16 including the laser diode 38 to a predetermined position of the opto-magnetic disk 12, and applies magnetism to the position for writing the signal WAS on the opto-magnetic disk 12.

The laser diode 38 converts the signal WAS into a laser beam and emits it on the opto-magnetic disk 12 to write the signal WAS on the opto-magnetic disk 12 in accordance with the recording format of the opto-magnetic disk 12.

Next, an explanation will be made of the operation when the data reproduction apparatus 40 of the data recording and reproduction apparatus 1 reproduces data from the opto-magnetic disk 12.

The disk system 10 rotates the opto-magnetic disk 12 in accordance with the control signal DC of the control apparatus 18, moves the position of the laser diode 38 to a predetermined position of the opto-magnetic disk 12, and emits a laser beam at the opto-magnetic disk 12.

The laser beam which is emitted from the laser diode 38, reflected from the opto-magnetic disk 12, and includes the data recorded on the opto-magnetic disk 12 is converted to an electric reproduced signal (signal RF) at the photodetector 42 and output to the reproduced signal amplification circuit 44.

The reproduced signal amplification circuit 44 amplifies the signal RF, discriminates its binary state, outputs the result as the signal RASB to the synchronization detection circuit 46, and outputs it as the signal RASA to the data selection circuit 48.

The synchronization detection circuit 46 detects the synchronization signal SYNC and the resynchronization signal RESYNC which is as same as SYNC, recorded in the synchronization signal area 170 in the data area 148 of the sectors 120 from the signal RASB and outputs the result as the signal SRDS to the control apparatus 18. The signal SRDS input from the synchronization detection circuit 46 to the control apparatus 18 is for example used as a synchronization signal for the generation of control signals for the different parts of the data recording and reproduction apparatus 1 by the control apparatus 18.

The data selection circuit 48 removes the synchronization signal SYNC and the resynchronization signal RESYNC recorded in the synchronization signal area 170 and resynchronization signal area 174$_j$ from the signal RASA in accordance with the control through the control signal DSC of the control apparatus 18 and outputs the result as the signal RDS to the data decoding circuit 50.

The data decoding circuit 50 performs RLL(1,7) decoding on the signal RCS in accordance with control through the control signal RCEC of the control apparatus 18 each time 3 bits of the encoded data are input (each encoding period) and outputs the result as the signal RES to the ECC decoder 52 and control apparatus 18. Note that if the encoded data corresponding to the constant data is decoded, the value becomes unstable, so the constant data is not decoded by the data decoding circuit 50.

The signal RCS includes the data recorded in the ID areas. The control apparatus 18 processes the data recorded in the track no. area 160, sector no. area 162, and CRC area 164 of the ID areas to detect the track no. and sector no. and performs processing for producing the disk system control signal DC for controlling the data recording and reproduction apparatus 1 based on these signals.

The ECC decoder 52 corrects the error of the data corresponding to the data area 172$_i$ in the signal RCS based on the error correction code included in the signal RCS. Further, the ECC decoder 52 removes the error correction code from the signal RCD and outputs just the data corresponding to the data area 172$_i$ as the signal RES to the decoded data output circuit 54.

The decoded data output circuit 54 outputs the signal RCS as the serial format output data OD.

By configuring the data recording and reproduction apparatus 1 in the above way, the encoded constant data is placed at the end of the encoded data, so it is possible to correctly decode to the end the encoded data recorded on the opto-magnetic disk 12.

Further, the ID areas of the opto-magnetic disk 12 are preformatted with the encoded constant data placed at the end, so it is possible to correctly decode to the end the CRC codes added to the track numbers and the sector numbers recorded in the ID areas. Accordingly, it is possible to correctly correct the errors of the track numbers and sector numbers which are important in the control of the data recording and reproduction apparatus 1.

In the data recording and reproduction apparatus 1 explained above, use was made of 4 bits of "0" as the constant data, but the constant data need only be known and are not limited to the values show in the above embodiment.

Further, the lengths of the data of the end-placed data areas 166 and 178 were made 1 byte (1 byte as the data before encoding and 12 bits as the data after encoding), but the length of the data may be any length so long as it is above 4 bits (4 bits as the data before encoding and 6 bits as the data after encoding).

The data recording and reproduction apparatus 1 was configured with the data recording apparatus 20 and the data reproduction apparatus 40 as one unit, but may also be configured by a separate data recording apparatus comprised of a combination of the data recording apparatus 20 and the disk system 10 and a data reproduction apparatus comprised of a combination of the data reproduction apparatus 40 and the disk system 10.

Further, it is possible to combine only the optical system 16, the constant data generation circuit 26, the data selection circuit 28, and the data encoding circuit 30 and use the result as a separate data encoding apparatus.

Also, it is possible to combine the data selection circuit 48 and the data decoding circuit 50 alone and use the result as a separate data decoding apparatus.

Still further, in the present embodiment, the components of the data recording and reproduction apparatus 1 were made by hardware, but these components may also be configured as software having equal functions in a computer.

Further, the encoding method and decoding method are not limited to RLL(1,7) encoding and RLL(1,7) decoding. Any other run-length limited encoding method generally known as (d,km,nr) encoding ((d,km,nr) modulation) and its decoding method may be also used. When using another encoding method and decoding method in this way, it is necessary to modify the length of the end-placed constant data, the recording format of the opto-magnetic disk 12, the configuration of the data encoding circuit 30, and the configuration of the data decoding circuit 50 in accordance with the encoding method and decoding method.

In addition to the embodiments explained above, the data recording and reproduction apparatus 1 of the present invention may be modified in many ways as shown by for example the above embodiments.

As explained above, according to the present invention, it is possible to accurately decode to the end the modulated data obtained by modulation by a method wherein the modulated data of a plurality of modulation timings such as run-length limited modulated data have a predetermined relationship.

Further, according to the present invention, it is possible to provide a data recording apparatus and a data reproduction apparatus having the above features.

Still further, when the method of modulation and the method of demodulation used in the present invention is for example RLL(1,7) modulation and RLL(1,7) demodulation, a high speed modulation operation and demodulation operation become possible due to the present invention. Further, the configuration of the apparatus for realizing these operations is simple.

What is claimed is:

1. A data modulation apparatus for modulating data by run-length limited (1, 7) modulation, comprising;

constant data adding means for receiving input data in the form of recorded data and address data and adding constant data to the ends of each of said recorded data and said address data, wherein said constant data added by said constant data adding means is data of at least the number of bits necessary when the last data of the input data is to be run-length limited (1, 7) decoded;

status data producing means for performing, in each modulation period, logical operations on at least part of the data output by said constant data adding means of each modulation period and the status data of the modulation period immediately before said each modulation period to produce status data of each modulation period; and modulated data producing means for performing, in each modulation period, logical operations on the data output by said constant data adding means of each modulation period and the status data of the modulation period immediately before said each modulation period to perform run-length limited (1, 7) modulation and produce modulated data.

2. A data demodulation apparatus which receives modulated data obtained by modulation of recording data and address data after the end of each of which constant data has been added for run-length limited (1,7) decoding and decodes the modulated data, comprising means for demodulating said modulated input data by performing logical operations based on run-length limited (1, 7) demodulation on said modulated data of each modulation period and the modulation data of the modulation period before said each modulation period, said modulated data corresponding to the last of said input data being demodulated using said modulated data corresponding to said constant data.

3. A run-length limited (1,7) modulated data recording apparatus, comprising;

constant data adding means for receiving input data in the form of recorded data and address data showing the addresses of the recorded data on a recording medium and adding constant data to the ends of each of said recorded data and said address data, wherein said constant data added by said constant data adding means is data of at least the number of bits necessary when the last data of the input data is to be run-length limited (1,7) decoded;

status data producing means for performing, in each modulation period, logical operations on at least part of the data output by said constant data adding means of each modulation period and the status data of the modulation period immediately before said each modulation period to produce status data of each modulation period;

modulated data producing means for performing, in each modulation period, logical operations on the data output by said constant data adding means of each modulation period and the status data of the modulation period immediately before said each modulation period to perform run-length limited (1,7) modulation and produce modulated data; and recording means for recording the modulated data produced by said modulated data producing means on a recording medium.

4. A recording medium on which are recorded data obtained by run-length limited modulation, said recorded data comprises a first known constant data added to the end of said recorded data for run-length limited (1,7) decoding, address data showing the recording positions of said recorded data on said recording medium, and a second known constant data added to the end of said address data for run-length limited (1, 7) decoding.

5. A recording medium as set forth in claim 4, wherein said run-length limited encoding is run-length limited (1, 7) modulation.

* * * * *